(12) United States Patent
Namkoong et al.

(10) Patent No.: US 7,838,300 B2
(45) Date of Patent: Nov. 23, 2010

(54) METHOD OF REDUCING TEMPERATURE DIFFERENCE BETWEEN A PAIR OF SUBSTRATES

(75) Inventors: Kak Namkoong, Yongin-si (KR); Su-hyeon Kim, Yongin-si (KR); Jin-tae Kim, Yongin-si (KR); Chin-sung Park, Yongin-si (KR); Young-sun Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 726 days.

(21) Appl. No.: 11/689,640

(22) Filed: Mar. 22, 2007

(65) Prior Publication Data

US 2008/0053647 A1 Mar. 6, 2008

(30) Foreign Application Priority Data

Sep. 4, 2006 (KR) ...................... 10-2006-0084819

(51) Int. Cl.
*G01N 25/20* (2006.01)
*B01L 3/02* (2006.01)

(52) U.S. Cl. .......................... 436/147; 436/2; 165/80.3; 165/185; 422/100

(58) Field of Classification Search ................. 257/720; 165/80.3, 185; 428/297.4; 436/2, 147
See application file for complete search history.

(56) References Cited

U.S. PATENT DOCUMENTS 6,988,533 B2 * 1/2006 Colbert et al. ............. 165/80.3
7,301,232 B2 * 11/2007 Leu et al. ..................... 257/712
7,351,360 B2 * 4/2008 Hougham et al. ........... 252/502
2004/0005720 A1 1/2004 Cremer et al.
2005/0006372 A1 1/2005 Murakami et al.
2005/0116336 A1 * 6/2005 Chopra et al. ............... 257/720

FOREIGN PATENT DOCUMENTS

| WO | 2005028549 A | 3/2005 |
|---|---|---|
| WO | 2006081135 A | 8/2006 |
| WO | 2006126427 A | 11/2006 |

OTHER PUBLICATIONS

European Search Report dated Jan. 2, 2008; Appl. No. 07104705.4-1528 (All references cited in Search Report are cited above).

* cited by examiner

*Primary Examiner*—N. Bhat
(74) *Attorney, Agent, or Firm*—Cantor Colburn LLP

(57) ABSTRACT

A method of reducing a temperature difference between a high-temperature and a low-temperature substrate includes interposing a heat transfer facilitating layer which has a higher thermal conductivity than air and can hold particles between the substrates, and maintaining close contact between the high-temperature substrate, the heat transfer facilitating layer, and the low-temperature substrate, wherein formation of an air layer can be at least substantially prevented between the high-temperature substrate and the heat transfer facilitating layer, and between the low-temperature substrate and the heat transfer facilitating layer.

10 Claims, 7 Drawing Sheets

METHOD OF REDUCING TEMPERATURE DIFFERENCE BETWEEN A PAIR OF SUBSTRATES

This application claims priority to Korean Patent Application No. 10-2006-0084819, filed on Sep. 4, 2006, and all the benefits accruing therefrom under 35 U.S.C. §119, the contents of which in its entirety are herein incorporated by reference.

BACKGROUND OF THE INVENTION

1. Field of the Invention

The present invention relates to a method of reducing the temperature difference between a pair of substrates, and more particularly to a method of mitigating heat transfer inhibition caused by particles caught between the pair of substrates in which heat is transferred through the contact surface between the substrates, and a fluid reaction device using the same.

2. Description of the Related Art

For example, a biochemical reaction such as a polymerase chain reaction ("PCR") requires a microfluidic reaction chip that accommodates a small amount of biochemical fluid, and a heater that periodically heats the microfluidic reaction chip while the heater contacts the microfluidic reaction chip. A lower portion of the microfluidic reaction chip that contacts the heater, and an upper portion of the heater that contacts the lower portion of the microfluidic reaction chip can be formed of a flat substrate. The substrate material can be silicon (Si) of a high thermal conductivity. In order to perform the biochemical reaction, the microfluidic reaction chip should be positioned to make a close contact with a substrate disposed on the upper portion of the heater and then heat generated from the heater is transferred to the microfluidic reaction chip.

Figure 1:
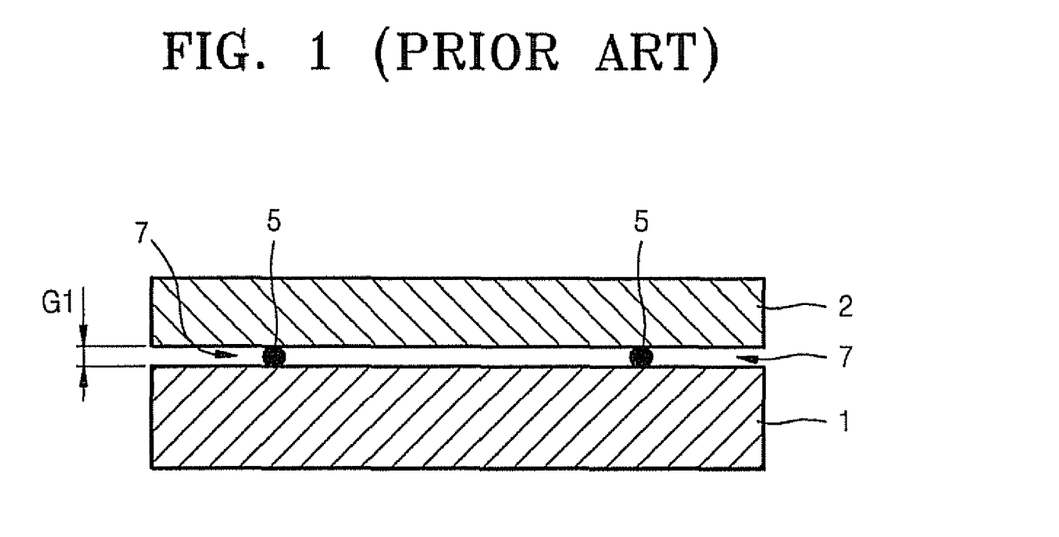
FIG. 1 is a diagram illustrating a temperature difference between a pair of substrates, which is caused by particles caught between the pair of substrates.

FIG. 1 is a diagram illustrating a temperature difference between a pair of substrates 1 and 2, which is caused by particles 5 caught between the pair of substrates 1 and 2.

Referring to FIG. 1, in the case of a substrate 1 disposed on the upper portion of a heater and a substrate 2 disposed on the lower portion of a microfluidic reaction chip as described above, particles 5, such as dust, could be caught between the pair of substrates 1 and 2 such that the particles would prevent heat transfer between the pair of substrates 1 and 2. That is, when the particles 5 are caught between a pair of the substrates 1 and 2, which are made of a hard material such as silicon (Si), an air layer 7 is formed between the pair of substrates 1 and 2 and prevents heat transfer from the high-temperature substrate 1 to the low-temperature substrate 2, respectively.

In particular, a temperature difference between the pair of substrates 1 and 2 can be calculated by multiplying the power output of the heater (not illustrated) by the thermal contact resistance between the pair of substrates 1 and 2. If a contact area of the pair of substrates 1 and 2 is 100 mm$^2$, a thickness G1 of the air layer 7 formed by the particles 5 is 10 microns (μm) and thermal conductivity of air is 0.031 W/(m·K) at 92 Celsius (° C.), the thermal contact resistance between the pair of substrates 1 and 2 can be estimated as 3.2 Celsius/watt (° C./W). Therefore, when the power output of the heater is 1 W, the temperature difference between the pair of substrates 1 and 2 is 3.2° C., and when the power output of the heater is 5 W, the temperature difference between the pair of substrates 1 and 2 is 16.0° C., and so on.

To reduce the thermal contact resistance caused by the caught particles, a method of using thermal grease at the interface, or a method of bonding the two substrates by thermal epoxy is conventionally used. However, when frequent contact and separation between a pair of substrates occurs as in the case of a microfluidic reaction chip and a heater, the thermal grease or thermal epoxy cannot be applied and it is highly possible that particles will be caught between the pair of substrates. Therefore, in order to reduce the effect of caught particles on the temperature difference between the pair of substrates, the contact surfaces where the microfluidic reaction chip makes contact with the heater must be carefully wiped and cleaned before the microfluidic reaction chip is mounted on the heater. However, such a method is not reliable because it is very inconvenient for users, since particles that users fail to wipe off still may exist even though the particles on the substrates have been completely wiped, in addition there also exists a possibility that new particles may be caught during the microfluidic reaction chip mounting on the heater.

BRIEF SUMMARY OF THE INVENTION

The present invention provides an exemplary method of reducing the temperature difference between a pair of substrates which frequently contact with each other and are separated from each other even if particles on the contact surfaces between the pair of substrates are not carefully removed, and a fluid reaction device using the same.

According to an exemplary embodiment of the present invention, a method of reducing a temperature difference between a high-temperature substrate and a low-temperature substrate, includes interposing a heat transfer facilitating layer which includes a higher thermal conductivity than air and can hold particles between the high-temperature substrate and the low-temperature substrate and maintaining close contact between the high-temperature substrate and the heat transfer facilitating layer, and between the low-temperature substrate and the heat transfer facilitating layer, wherein formation of an air layer can be prevented between the high-temperature substrate and the heat transfer facilitating layer, and between the low-temperature substrate and the heat transfer facilitating layer.

The heat transfer facilitating layer may be formed of a graphite sheet, such as a pyrolytic graphite sheet formed by pyrolysis.

The heat transfer facilitating layer may have a thermal conductivity of about 100 W/(m·K) to about 10,000 W/(m·K) in a direction parallel to the heat transfer facilitating layer.

The heat transfer facilitating layer may have a thickness of about 10 μm to about 1,000 μm. At least one of the high-temperature substrate and the low-temperature substrate may include silicon (Si). The heat transfer facilitating layer may include a metal or carbon-nano-tube ("CNT"), and the metal may be one of gold (Au), silver (Ag), copper (Cu), aluminum (Al), lead (Pb)-free solder and a combination including at least one of the foregoing metals.

The heat transfer facilitating layer may be formed as a thin film on a surface of at least one of the high-temperature substrate and the low-temperature substrate, and the heat transfer facilitating layer may be directly placed or fixed to at least one of the high-temperature substrate and the low-temperature substrate without interposing an adhesive there between.

According to other exemplary embodiments of the present invention, a fluid reaction device includes a microfluidic reaction chip which accommodates a fluid, a heater which heats the microfluidic reaction chip and a heat transfer facilitating layer which is interposed between the microfluidic reaction chip and the heater, the heat transfer facilitating layer may include a higher thermal conductivity than air and may hold particles, wherein the heater, the heat transfer facilitating layer and the microfluidic reaction chip are fixed or held together such that the formation of an air layer may be prevented between the heater and the heat transfer facilitating layer, and between the microfluidic reaction chip and the heat transfer facilitating layer.

The heat transfer facilitating layer may be formed of a graphite sheet, such as a pyrolytic graphite sheet formed by pyrolysis.

The heat transfer facilitating layer may include a thermal conductivity of about 100 W/(m·K) to about 10,000 W/(m·K) in an X-Y direction of, a direction parallel to, the heat facilitating layer.

The heat transfer facilitating layer may include a thickness of about 10 μm to about 1,000 μm. A part of the heater which contacts the heat transfer facilitating layer may include the high-temperature substrate, and one portion of the microfluidic reaction chip which contacts the heat transfer facilitating layer may include the low-temperature substrate. At least one of the high-temperature substrate and the low-temperature substrate may include silicon (Si).

The heat transfer facilitating layer may include a metal or a carbon-nano-tube (CNT). The metal may be one of gold (Au), silver (Ag), copper (Cu), aluminum (Al), lead (Pb)-free solder, and a combination including at least one of the foregoing metals.

The heat transfer facilitating layer may be formed as a thin film on a surface of the heater.

The heat transfer facilitating layer may be directly placed or fixed on at least one of the heater and the microfluidic reaction chip without interposing an adhesive there between.

The microfluidic reaction chip may be separably placed or fixed on the heat transfer facilitating layer, and the heat transfer facilitating layer may remain in contact with the heater even when the microfluidic reaction chip is separated from the heat transfer facilitating layer.

BRIEF DESCRIPTION OF THE DRAWINGS

The above and other aspects, features and advantages of the present invention will become more apparent by describing in more detail exemplary embodiments thereof with reference to the attached drawings in which.

DETAILED DESCRIPTION OF THE INVENTION

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Figure 2:
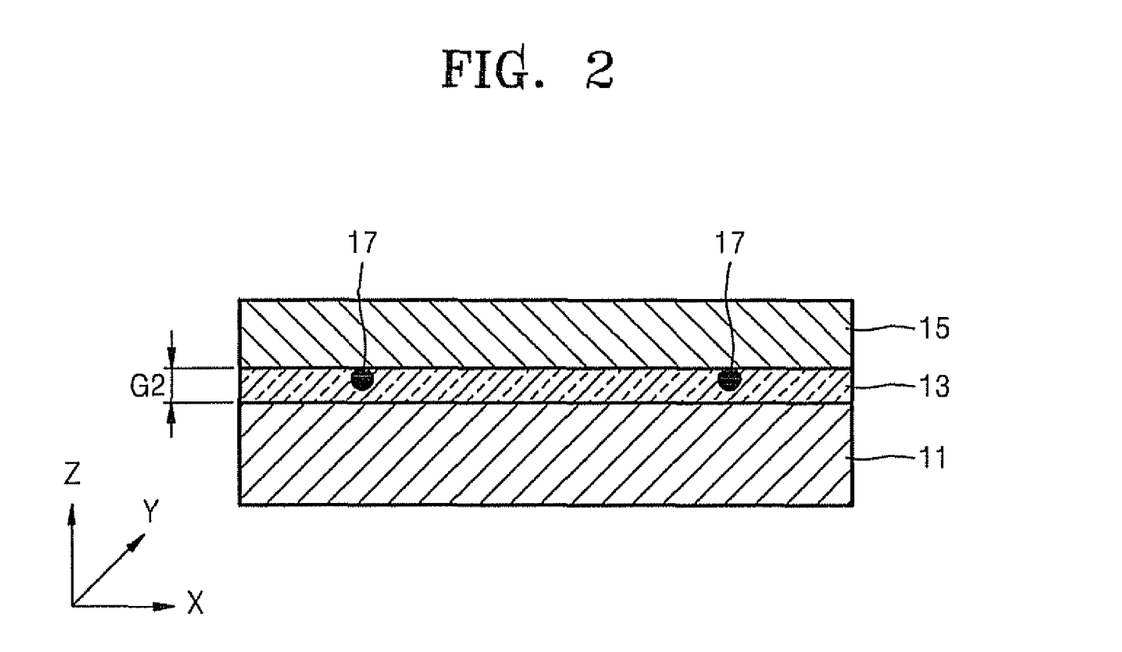
FIG. 2 is a diagram illustrating an exemplary method of reducing a temperature difference between a high-temperature substrate and a low-temperature substrate according to the present invention.
Figure 3:
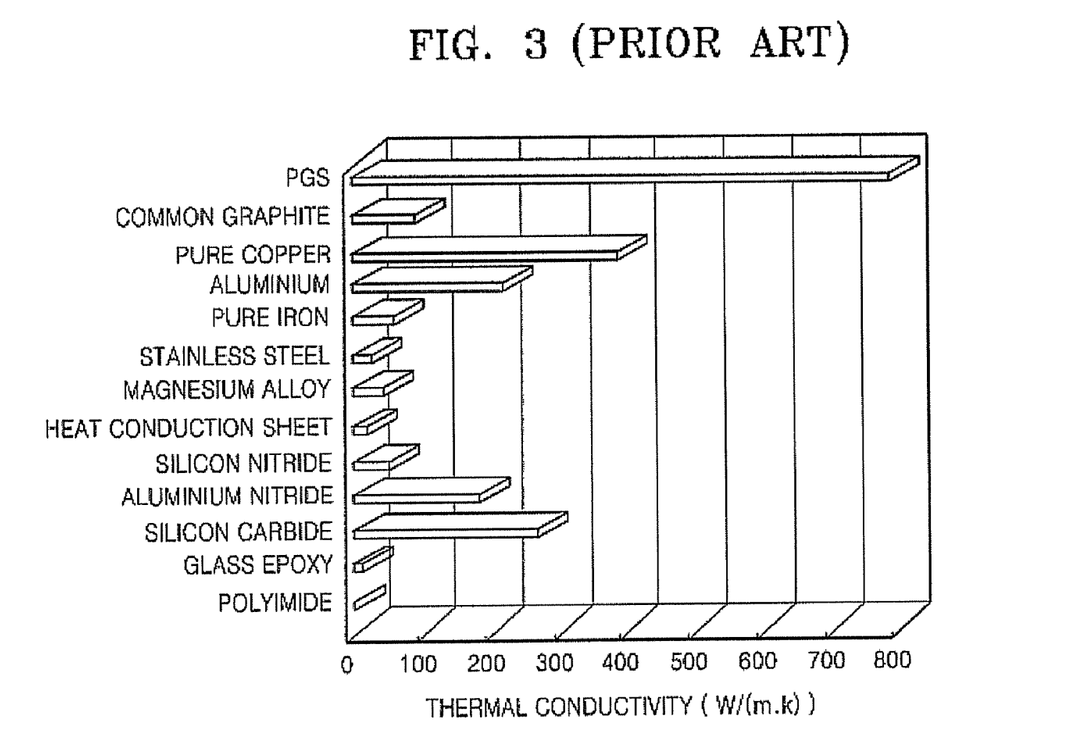
FIG. 3 is a graph illustrating thermal conductivity of PGS® Pyrolytic Graphite Sheet (Panasonic Industrial) in the direction parallel to the sheet as compared with those of other materials.

FIG. 2 is a diagram illustrating a method of reducing a temperature difference between a high-temperature substrate 11 and a low-temperature substrate 15 according to an exemplary embodiment of the present invention, and FIG. 3 is a graph illustrating thermal conductivity of PGS® Pyrolytic Graphite Sheet (Panasonic Industrial) in the direction parallel to the sheet as compared with those of other materials.

Referring to FIG. 2, heat is transferred from the high-temperature substrate 11 to the low-temperature substrate 15. A heat transfer facilitating layer 13 is interposed between the high-temperature substrate 11 and the low-temperature substrate 15, and thus the high-temperature substrate 11, the heat transfer facilitating layer 13 and the low-temperature substrate 15 contact closely with one another such that the formation of an air layer can be prevented between the high-temperature substrate and the heat transfer facilitating layer, and between the low-temperature substrate and the heat transfer facilitating layer.

The heat transfer facilitating layer 13 includes a higher thermal conductivity than air (about 0.025 W/(m·K) at a room temperature) which blocks heat conduction, and is formed of a low-hardness material that can hold particles 17, such as dust. The heat transfer facilitating layer 13 can contain the particles 17 caught between the high-temperature substrate 11 and the low-temperature substrate 15, and thus the formation of the air layer 7 (see FIG. 1) can be prevented even in the case where the high-temperature substrate 11 and the low-temperature substrate 15 are made of a high-thermal-conductivity but high-hardness material, such as silicon (Si). When a thickness G2 of the heat transfer facilitating layer 13 is too large, heat transfer from the high-temperature substrate 11 to the low-temperature substrate 15 may be delayed. When the thickness G2 of the heat transfer facilitating layer 13 is less than the size of the particles 17, it may be difficult for the heat transfer facilitating layer 13 to hold the particles 17. Therefore, in the current exemplary embodiment of the present invention, the thickness G2 is between about 10 μm to about 1,000 μm.

In the current exemplary embodiment of the present invention, the heat transfer facilitating layer 13 is formed of a graphite sheet and an example of commercially available graphite sheets is PGS® Pyrolytic Graphite Sheet. PGS® Pyrolytic Graphite Sheet is a graphite sheet developed by Panasonic Industrial, Japan, and has a more planar and uniform layer structure than other commercial graphite sheets, according to the information provided by Panasonic Industrial. Referring to FIG. 3, which illustrates the information provided by Panasonic Industrial, PGS® Pyrolytic Graphite Sheet includes a thermal conductivity of 700 to 800 W/(m·K) in the direction parallel to the sheet, and this value is two times as high as that of copper (Cu). Meanwhile, thermal conductivity of PGS® Pyrolytic Graphite Sheet in the direction perpendicular to the sheet is 15 W/(m·K).

As illustrated in FIG. 2, the high-temperature substrate 11, the heat transfer facilitating layer 13 and the low-temperature substrate 15 are in close contact with each other. In the present exemplary embodiment, heat is transferred along the Z direction from the high-temperature substrate 11 to the low-temperature substrate 15. When heat transfer along the Z direction is inhibited or substantially prevented by particles 17, heat detours along the X-Y direction of the heat transfer facilitating layer 13 and is transferred to the low-temperature substrate 15. Therefore, as compared to the conventional method (see FIG. 1), the heat transfer from the high-temperature substrate 11 to the low-temperature substrate 15 is improved, and the temperature difference between the high-temperature substrate 11 and the low-temperature substrate 15 is reduced.

The heat transfer facilitating layer 13 formed of graphite sheet is of a thin sheet type, and is fixed, such as held, to the high-temperature substrate 11 or the low-temperature substrate 15 by a clamping method. Because adhesives are generally of very low thermal conductivity and thereby deteriorate the heat transfer from the high-temperature substrate 11 to the low-temperature substrate 15, the heat transfer facilitating layer 13 is held to the high-temperature substrate 11 or the low-temperature substrate 15 without using adhesives.

The heat transfer facilitating layer 13 may be formed of a metal or a carbon-nano-tube ("CNT"). Exemplary embodiments of the metal which can form the heat transfer facilitating layer 13 include gold (Au), silver (Ag), copper (Cu), aluminum (Al), lead (Pb) free solder and the like, which have a good thermal conductivity and low hardness. The CNT is a material which has a maximum thermal conductivity of about 10,000 W/(m·K). In alternative exemplary embodiments, the material of the heat transfer facilitating layer 13 is not limited thereto, and can be any soft and flexible materials which can have a thermal conductivity in the X-Y direction of 100-10,000 W/(m·K) and can hold the particles 17.

If the heat transfer facilitating layer 13 formed of graphite sheet, metal or CNT is of a thin sheet type, the heat transfer facilitating layer 13 can be simply held to the surface of the high-temperature substrate 11 or the surface of the low-temperature substrate 15 by a clamping method. In an alternative exemplary embodiment, the heat transfer facilitating layer 13 may also be formed as a thin film on the surface of the high-temperature substrate 11 or on the surface of the low-temperature substrate 15 by Micro-Electro-Mechanical System ("MEMS") manufacturing methods such as plating, deposition, sputtering and the like.

Figure 4:
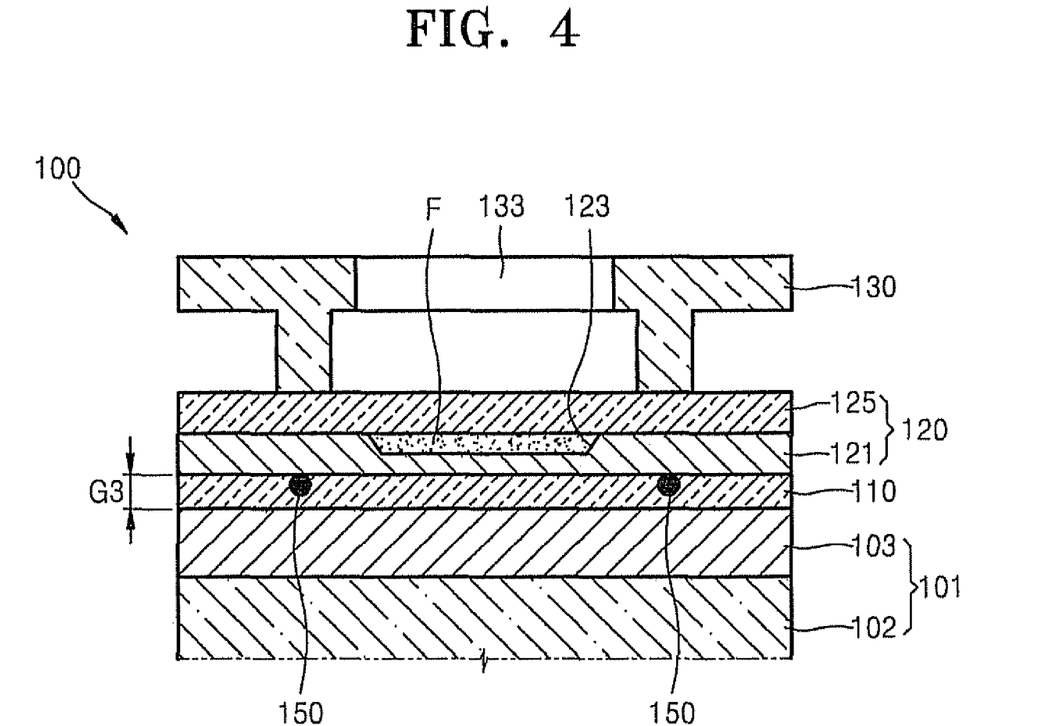
FIG. 4 is a cross-sectional view illustrating an exemplary fluid reaction device according to an exemplary embodiment of the present invention.

FIG. 4 is a cross-sectional view illustrating an exemplary fluid reaction device 100 according to an exemplary embodiment of the present invention.

Referring to FIG. 4, the fluid reaction device 100 includes a microfluidic reaction chip 120, a heater 101 that heats the microfluidic reaction chip 120, a heat transfer facilitating layer 110 that is interposed between the heater 101 and the microfluidic reaction chip 120.

The microfluidic reaction chip 120 includes a chamber 123 in which a small amount of a biochemical fluid F is accommodated and a reaction of the biochemical fluid F occurs. The microfluidic reaction chip 120 is formed of a lower substrate 121 in which the chamber 123 is formed, and an upper substrate 125 that is bonded to the lower substrate 121. The lower substrate 121 is a low-temperature substrate that absorbs heat transferred from the heater 101, and is made of a material such as silicon (Si), which has a high thermal conductivity. The upper substrate 125 is made of a transparent material such as glass in order to perform a fluorescent detection of a biochemical reaction such as a PCR occurring in the chamber 123. Holes (not illustrated) can be formed in the upper substrate 125 in order to supply the biochemical fluid F to the chamber 123, to extract the biochemical fluid F accommodated in the chamber 123 to the outside, or to vent air to the outside.

The heater 101 includes a heat source 102 which generates heat by a supplied power, and a high-temperature substrate 103 which contacts the heat transfer facilitating layer 110 and is formed on the top surface of the heat source 102. The high-temperature substrate 103 is made of a material such as silicon (Si), which has a high thermal conductivity.

The heat transfer facilitating layer 110 is made of a material that has a higher thermal conductivity than air, and a low hardness such that the layer 110 can hold particles 150 such as dust, such as the heat transfer facilitating layer 13 illustrated in FIG. 2. The heat transfer facilitating layer 110 is disposed between the heater 101 and the microfluidic reaction chip 120 such that the heat transfer facilitating layer covers a surface of the microfluidic chip 120 facing the heater 101 and is in contact with the heater 101. More particularly, a first surface of the heat transfer facilitating layer 110 faces and contacts a surface of the high temperature substrate 103 in a face to face relationship, and a second surface of the heat transfer facilitating layer 110 faces and contacts a surface of the lower substrate 121 in a face to face relationship. In the current exemplary embodiment of the present invention, the heat transfer facilitating layer 110 is made of a thin graphite sheet. In addition, in the current exemplary embodiment of the present invention, the heat transfer facilitating layer 110 may have a thickness G3 of about 10 μm to about 1,000 μm.

The fluid reaction device 100 further includes a pressure member 130 in order to hold the microfluidic reaction chip 120 to the heater 101 and the heat transfer facilitating layer 110. When the microfluidic reaction chip 120 is pressurized downwards by the pressure member 130, the high-temperature substrate 103 of the heater 101, the heat transfer facilitating layer 110 and the low-temperature substrate 121 of the microfluidic reaction chip 120 are held together. Even if particles 150 are caught between the microfluidic reaction chip 120 and the heat transfer facilitating layer 110 or between the heater 101 and the heat transfer facilitating layer 110, the particles 150 can be held in the heat transfer facilitating layer 110 by pressure applied from the pressure member 130. Therefore, the formation of an air layer 7 (see FIG. 1) between the high-temperature substrate 103 and the low-temperature substrate 121 can be inhibited or substantially prevented. When power is supplied to the heat source 102 under the condition that the high-temperature substrate 103, the heat transfer facilitating layer 110 and the low-temperature substrate 121 are held together, heat generated by the heat source 102 can be transferred to the low-temperature substrate 121 without substantial heat loss through the heat transfer facilitating layer 110.

The microfluidic reaction chip 120, in which a reaction of the biochemical fluid F occurs due to heat transfer, can be separated from the heater 101 and the heat transfer facilitating layer 110 after the pressure member 130 is removed and then microfluidic reaction chip 120 may be disposed. The microfluidic reaction chip 120 is conventionally disposable, and thereby separates from the heater 101 and the heat transfer facilitating layer 110 after the reaction of the biochemical fluid F has been performed. However, the heater 101 and the heat transfer facilitating layer 110 does not need to be separated even after the reaction of the biochemical fluid F has been performed. In an exemplary embodiment, the heater 101 and the heat transfer facilitating layer 110 remain held to each other because the particles 150 cannot be caught between the high-temperature substrate 103 and the heat transfer facilitating layer 110 when the heat transfer facilitating layer 110 remains held to the heater 101. Therefore, the heater 101 and the heat transfer facilitating layer 110 can be held to each other by an additional clamping member (not illustrated) regardless of the pressure member 130. Since an adhesive has a very low thermal conductivity, and thereby deteriorates the heat transfer between the high-temperature substrate 103 and the heat transfer facilitating layer 110, an adhesive is preferably not interposed between the high-temperature substrate 103 and the heat transfer facilitating layer 110. A transparent light-transmitting part 133 is formed in the pressure member 130 for fluorescent detection of a reaction of the biochemical fluid F such as PCR occurring in the chamber 123.

While an exemplary embodiment of the heat transfer facilitating layer 110 has been described as made of a thin graphite sheet, in alternative exemplary embodiments, the heat transfer facilitating layer 110 may be formed of a metal or a CNT. Exemplary embodiments of the metal include gold (Au), silver (Ag), copper (Cu), aluminum (Al), lead (Pb) free solder and the like, which have a high thermal conductivity and a low hardness. The CNT is a material that has a maximum thermal conductivity of about 10,000 W/(m·K). However, in alternative exemplary embodiments, the material of the heat transfer facilitating layer 110 is not limited thereto, and can be any soft materials that have a thermal conductivity of 100-10,000 W/(m·K) in the direction parallel to the layer and can hold particles 150.

The heat transfer facilitating layer 110, which is formed of graphite sheet, metal or CNT can be held to the surface of the high-temperature substrate 103 by a clamping method. However, the heat transfer facilitating layer 110 can also be formed as a thin film on the surface of the high-temperature substrate 103 by MEMS manufacturing methods such as plating, deposition, sputtering and the like.

To verify the effects of the fluid reaction device 100, an experiment was conducted to compare a conventional fluid reaction device of the prior art with a fluid reaction device 100 according to an exemplary embodiment of the present invention, and the experiment results will be described in more detail with reference to the accompanying drawings.

Figure 5A:
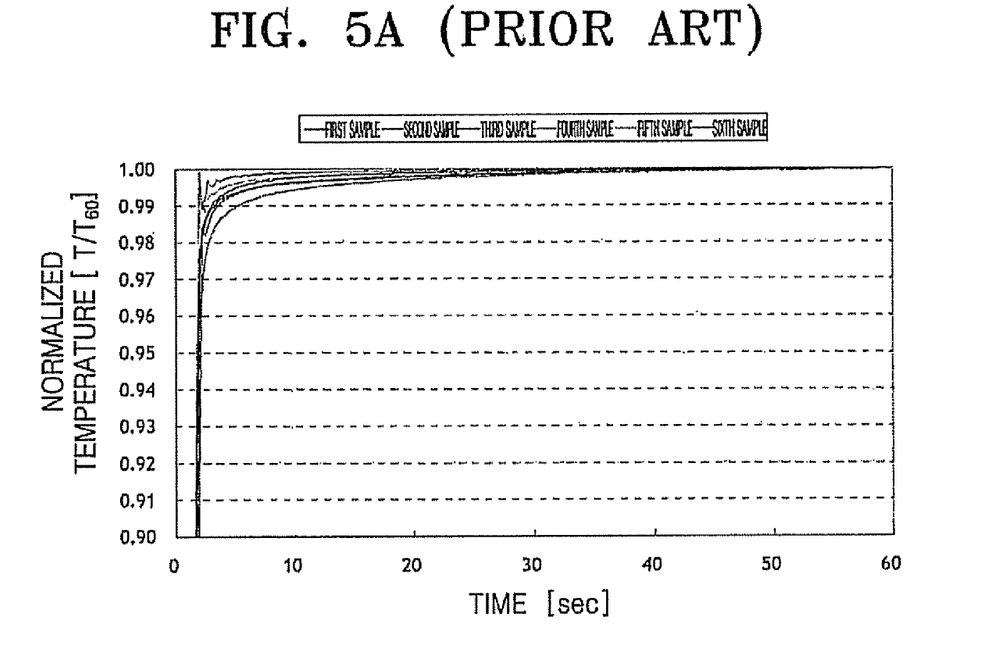
FIG. 5A is a graph illustrating a temperature profile of a microfluidic reaction chip with respect to time in a conventional fluid reaction device of the prior art.
Figure 5B:
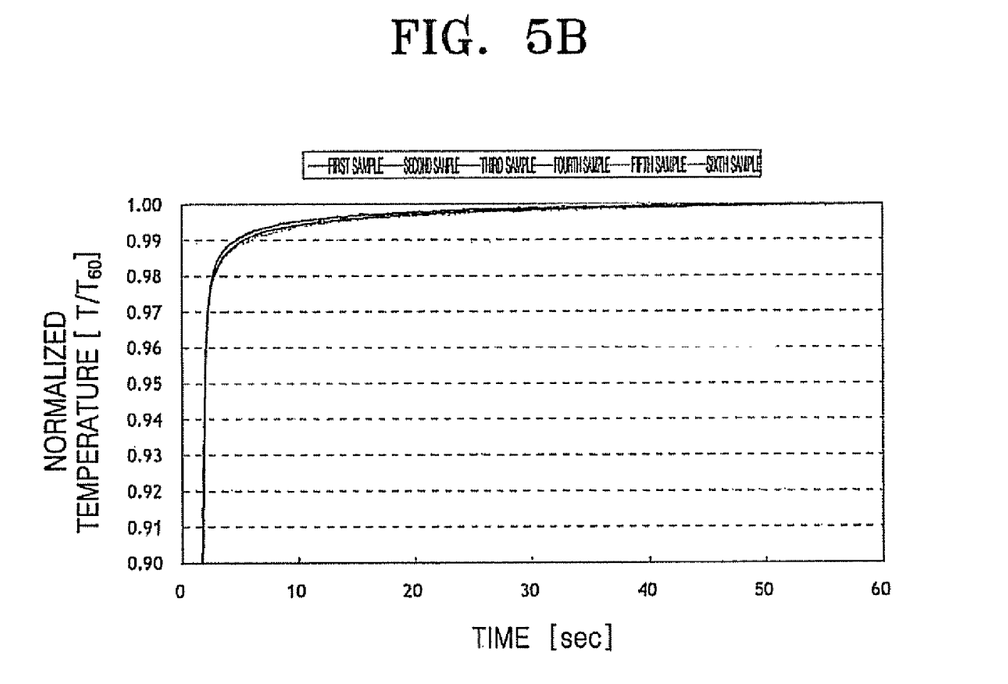
FIG. 5B is a graph illustrating a temperature profile of the exemplary fluid reaction device of FIG. 4.

FIG. 5A is a graph illustrating temperature profiles of a microfluidic reaction chip with respect to time in a conventional fluid reaction device of the prior art, and FIG. 5B is a graph illustrating temperature profiles of a microfluidic reaction chip with respect to time in the fluid reaction device 100 according to an exemplary embodiment of the present invention as illustrated in FIG. 4. The fluid reaction device 100 according to an exemplary embodiment of the present invention includes a heat transfer facilitating layer 110 (see FIG. 4) which was made of PGS® Pyrolytic Graphite Sheet, and had a thickness G3 of 100 μm. In this experiment, the conventional fluid reaction device denotes a conventional fluid reaction device of the prior art and the fluid reaction device 100 denotes an exemplary embodiment of the present invention (see FIG. 4).

In FIG. 5A, the temperature changes of a microfluidic reaction chip for sixty seconds are shown when the heater-contact surface of the microfluidic reaction chip and the upper surface of the heater were carefully wiped such that particles such as dust were removed before the microfluidic reaction chip was mounted on the heater of a conventional fluid reaction device, and then a certain electric power was abruptly supplied to the heater. From the results of FIG. 5A, the average of 'temperature rising time' for the six microfluidic reaction chip samples having identical size and shape was 3.34 seconds, the standard deviation was 1.03 seconds and the coefficient of variance (% CV) was 30.68%. 'Temperature rising time' stands for a time that it took for the temperature of each sample to reach a temperature that is 99% of $T_{60}$, i.e., the temperature of the sample 60 seconds after abrupt heating. In this experiment, the % CV denotes the percentage of standard deviation divided by average.

FIG. 5B represents temperature changes of a microfluidic reaction chip for sixty seconds when the microfluidic reaction chip was mounted on a heat transfer facilitating layer of a fluid reaction device 100 according to an exemplary embodiment of the present invention without the process of removing particles on the heat transfer facilitating layer, and then a certain electric power was abruptly supplied to the heater. From the results of FIG. 5B, the average of 'temperature rising time' for the six microfluidic reaction chip samples having identical size and shape was 5.14 seconds, the standard deviation was 0.46 seconds and the % CV was 9.04%. From the results of the experiment, it can be seen that the standard deviation and the % CV of the fluid reaction device 100 of FIG. 4, according to an exemplary embodiment of the present invention, were significantly reduced as compared to those of the conventional fluid reaction device of the prior art.

Figure 6A:
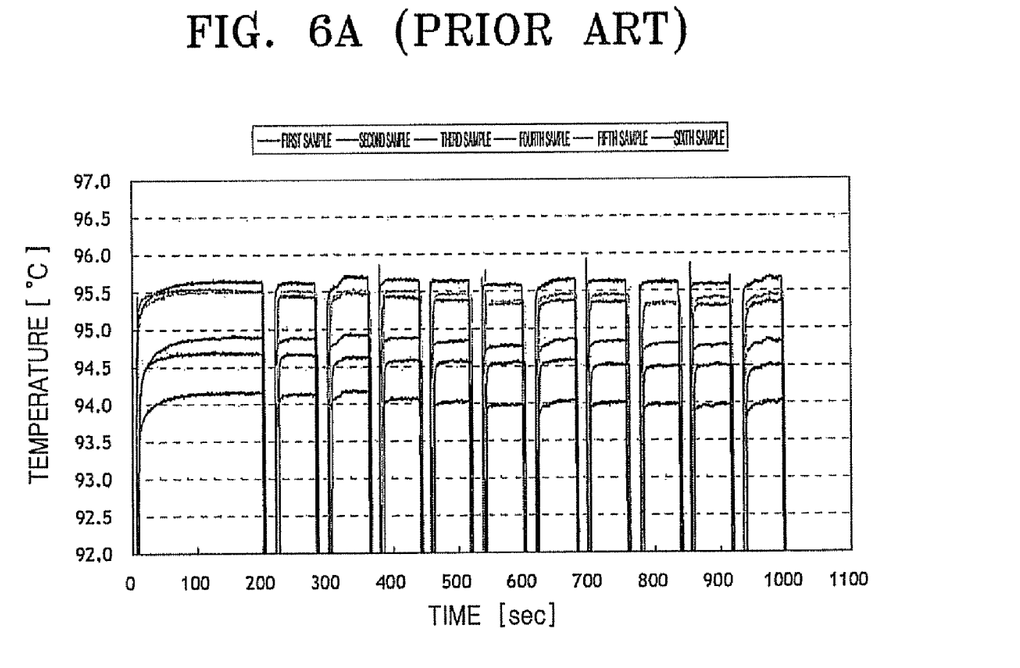
FIG. 6A is a graph illustrating chip/heater contact reproducibility of a microfluidic reaction chip in a conventional fluid reaction device of the prior art.
Figure 6B:
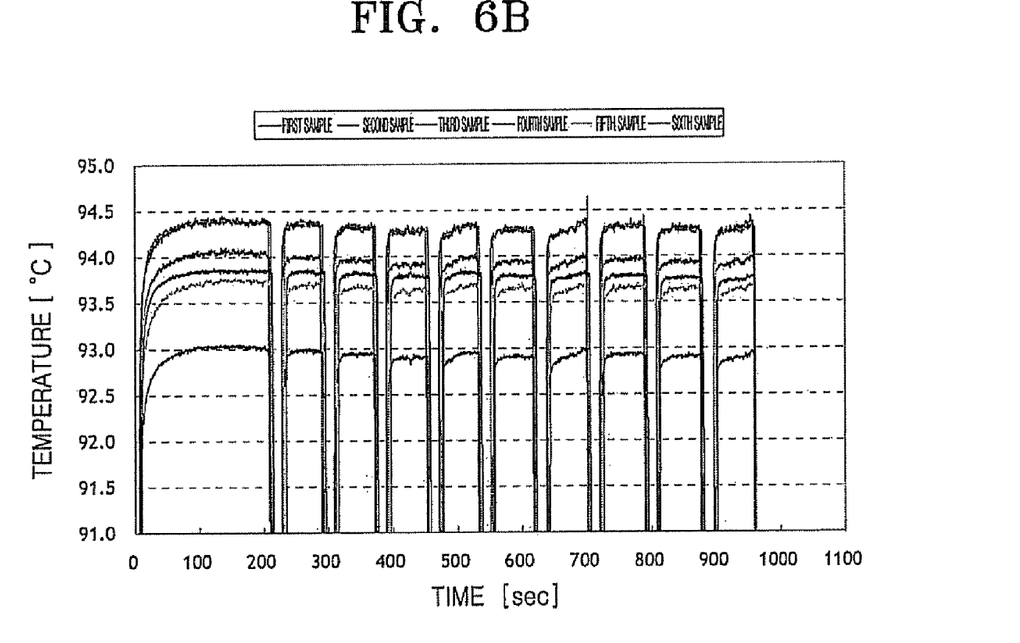
FIG. 6B is a graph illustrating chip/heater contact reproducibility of the exemplary fluid reaction device of FIG. 4.

FIG. 6A is a graph illustrating chip/heater contact reproducibility of a microfluidic reaction chip using a conventional fluid reaction device of the prior art, that is, a fluid reaction device excluding a heat transfer facilitating layer 110 (see FIG. 4), and FIG. 6B is a graph illustrating chip/heater contact reproducibility of a fluid reaction device of FIG. 4 including a heat transfer facilitating layer 110 made of PGS® Pyrolytic Graphite Sheet that has a thickness G3 of 100 μm.

FIG. 6A represents temperature changes with respect to time of a microfluidic reaction chip mounted on a heater of a conventional fluid reaction device of the prior art while a certain electric power was being supplied to the heater. The microfluidic reaction chip was separated from the heater for ten seconds after an initial two hundred seconds during which the microfluidic reaction chip contacted the heater, and then the microfluidic reaction chip contacts the heater again for sixty seconds and separated from the heater again for ten seconds, respectively. The experiment was performed for six samples that have the identical size and shape, and the experiment involves a process of removing particles such as dust by carefully wiping the heater-contact surface of the microfluidic reaction chip and the upper surface of the heater before the microfluidic reaction chip was mounted on the heater. From the results illustrated in FIG. 6A, an average temperature for ten seconds before the microfluidic reaction chip was separated from the heater was obtained and then a temperature range (range=maximum value−minimum value) with respect to a total 11 average temperatures was obtained. From the results of the six samples, the average value of the temperature ranges was 0.17° C., the standard deviation of the temperature ranges was 0.03° C. and % CV was 19.54%.

FIG. 6B represents temperature changes of a microfluidic reaction chip mounted on the heat transfer facilitating layer of a fluid reaction device of FIG. 4, according to an exemplary embodiment of the present invention, without the process of removing particles on the transfer facilitating layer while a certain electric power was being supplied to the heater. The microfluidic reaction chip was separated from the heater and the heat transfer facilitating layer for ten seconds after an initial two hundred seconds during which the microfluidic reaction chip contacted the heater and the heat transfer facilitating layer, and then the microfluidic reaction chip contacted the heater and the heat transfer facilitating layer again for sixty seconds and then was again separated from the heater and the heat transfer facilitating layer for ten seconds, respectively. The experiment was performed with respect to six samples having the identical size and shape. From the results illustrated in FIG. 6B, an average temperature for ten seconds before the microfluidic reaction chip was separated from the heater and the heat transfer facilitating layer was obtained and then a temperature range (range=maximum value−minimum value) with respect to the total 10 average temperatures was obtained. From the results of six samples, the average value of the temperature ranges was 0.11° C., the standard deviation of the temperature ranges was 0.01° C. and % CV was 9.74%.

From the results of the experiment, it is seen that the average value, the standard deviation of and % CV of temperature ranges in the fluid reaction device, according to an exemplary embodiment of the present invention, were significantly reduced as compared to the cases of the conventional fluid reaction device. In addition, from the results illustrated in FIGS. 5B and 6B, it can be observed that even if the heater-contact surface of the microfluidic reaction chip and the upper surface of the heater is not carefully wiped, the temperature reproducibility of the microfluidic reaction chips is significantly better in a fluid reaction device according to an exemplary embodiment of the present invention than in a conventional fluid reaction device.

Figure 7A:
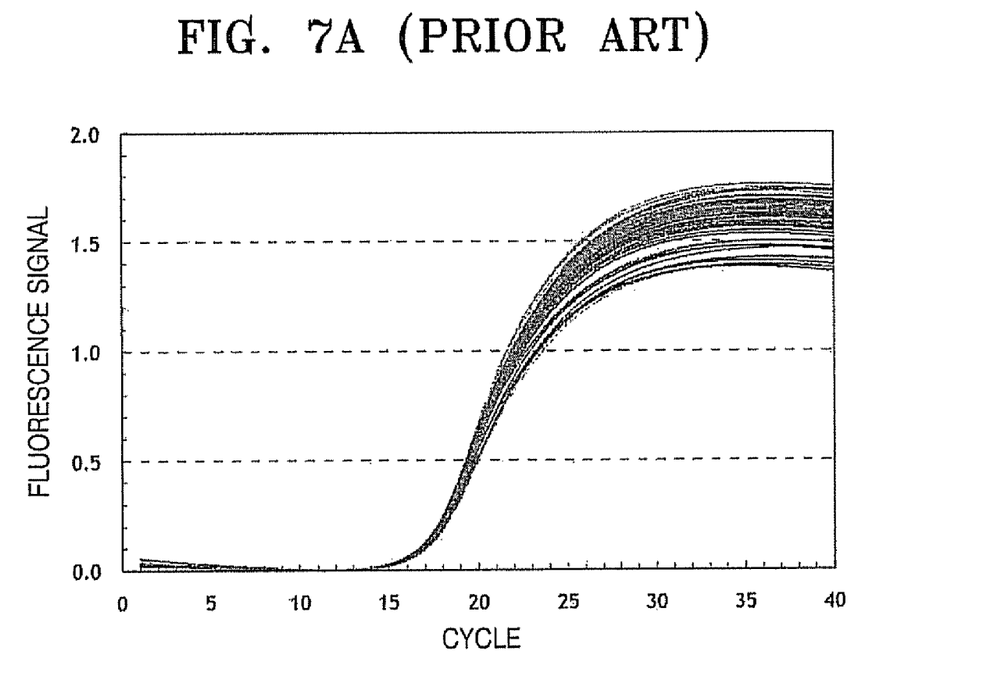
FIG. 7A is a graph illustrating results of polymerase chain reaction ("PCR") using a conventional fluid reaction device of the prior art.
Figure 7B:
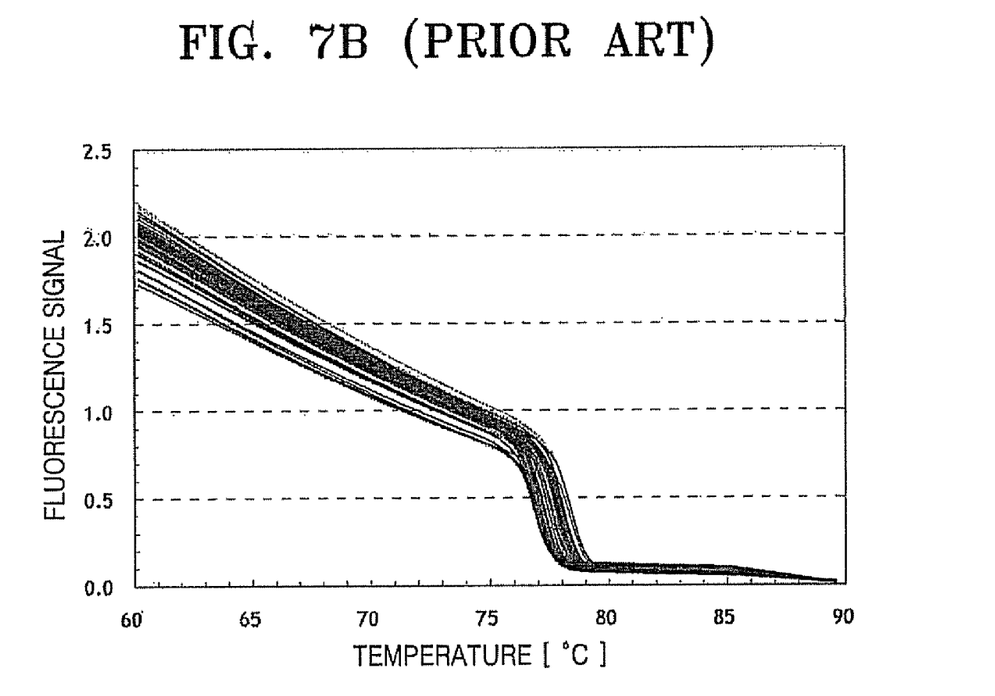
FIG. 7B is a graph illustrating a melting analysis curve using a conventional fluid reaction device of the prior art.
Figure 8A:
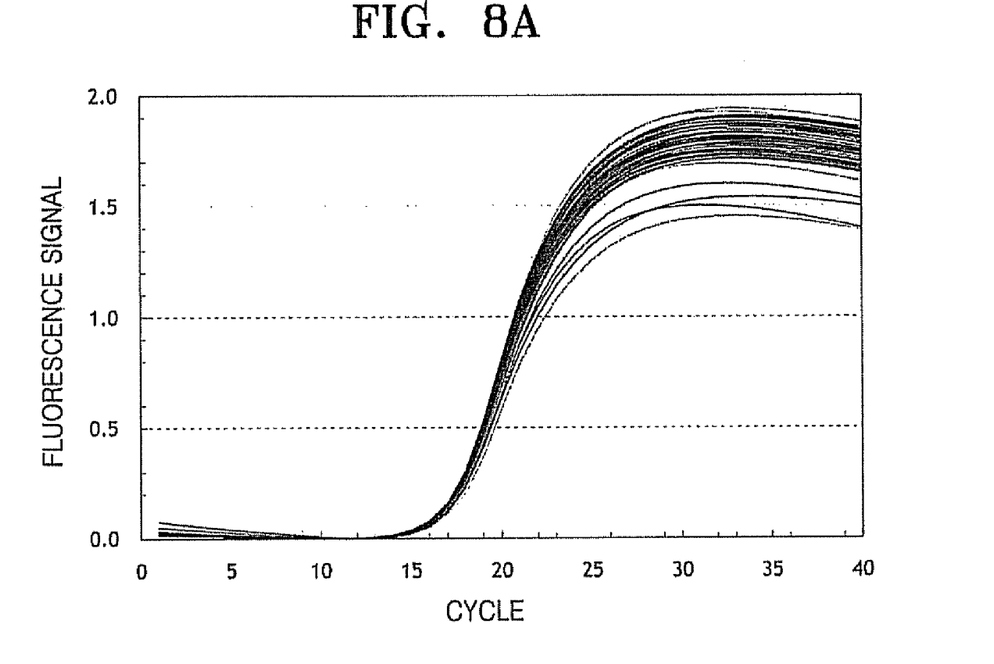
FIG. 8A is a graph illustrating PCR results using the exemplary fluid reaction device of FIG. 4.
Figure 8B:
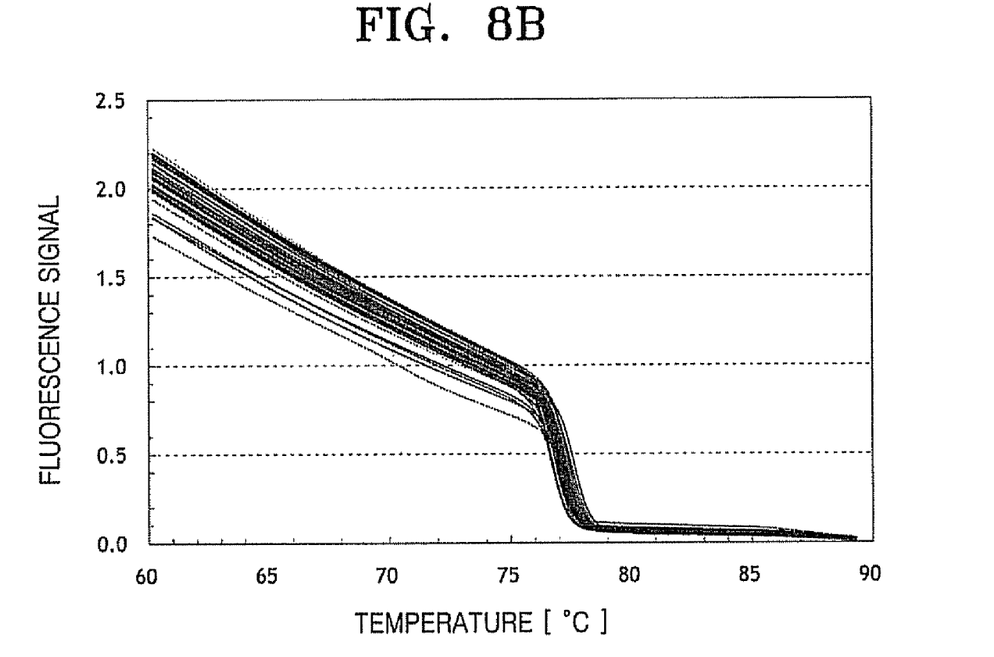
FIG. 8B is a graph illustrating a melting analysis curve using the exemplary fluid reaction device of FIG. 4.

A PCR was performed and the results were compared by fluorescent detection of a conventional fluid reaction device, that is, a fluid reaction device excluding a heat transfer facilitating layer 110, and a fluid reaction device according to an exemplary embodiment of the present invention, which particularly includes a heat transfer facilitating layer 110 having a thickness G3 of 100 μm and made of PGS® Pyrolytic Graphite Sheet. FIGS. 7A and 7B are graphs illustrating PCR results using a conventional fluid reaction device. FIG. 7A is a graph illustrating a PCR amplification curve, and FIG. 7B is a graph illustrating a melting analysis curve. FIGS. 8A and 8B are graphs illustrating PCR results using a fluid reaction device according to an exemplary embodiment of the present invention. FIG. 8A is a graph illustrating a PCR amplification curve, and FIG. 8B is a graph illustrating a melting analysis curve.

A sample fluid having a concentration of 106 copy/μl Hepatitis B virus ("HBV") was used, the PCR and melting experiment were performed 72 times repeatedly in the conventional fluid reaction device and the fluid reaction device according to an exemplary embodiment of the present invention, respectively. The surface of the heater of the conventional fluid reaction device was carefully wiped before a microfluidic reaction chip was mounted on the heater to remove particles, such as dust.

From the results illustrated in FIG. 7A, the average value of a threshold cycle ("Ct") was 17.87, the standard deviation of Ct was 0.04 and % CV was 0.22%. From the results illustrated in FIG. 7B, the average value of melting temperature ("Tm") was 77.18° C., the standard deviation of Tm was 0.33° C. and % CV was 0.43%. From the results illustrated in FIG. 8A, the average value of Ct was 18.07, the standard deviation of Ct was 0.11 and % CV was 0.58%, and from the results illustrated in FIG. 8B, the average value of Tm was 77.14° C., the standard deviation of Tm was 0.21° C. and % CV was 0.27%.

Comparing the results illustrated in FIG. 7A with the results illustrated in FIG. 8A, it is found that the average, the standard deviation and % CV of Ct from a fluid reaction device according to the present invention have slightly higher values than those from a conventional fluid reaction device. However, such small increases are within an acceptable error range. By comparing the results illustrated in FIG. 7B with the results illustrated in FIG. 8B, the Tm average from a fluid reaction device according to the present invention is very similar to that from a conventional fluid reaction device, and the standard deviation and % CV of Tm from a fluid reaction device according to the present invention are significantly reduced as compared to those from a conventional fluid reaction device. From the results illustrated in FIGS. 8A and 8B, it can be seen that when the fluid reaction device according to the present invention is used, an effect of reducing a negative influence due to particles is expected without the need to remove the particles, and thus similar or even improved PCR results can be obtained as compared to the case that the removal of particles is attempted using a conventional fluid reaction device.

According to the present invention, the process of removing particles by carefully wiping contact surfaces of a pair of substrates, through which heat transfer occurs, is not required in a situation where frequent contact and separation between the pair of substrates is desired. In addition, even when particles which users fail to remove remain on the contact surfaces, or new particles are caught onto the contact surfaces again, there is a small temperature difference between the pair of substrates, which include a high-temperature substrate and a low-temperature substrate, respectively.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, in FIG. 2, a reference numeral 11 that is placed on a relatively lower portion is a high-temperature substrate, and a reference numeral 15 that is placed on a relatively upper portion is a low-temperature substrate. However, the principle of the present invention can be applied even when the reference numeral 11 (lower substrate) is a low-temperature substrate, and the reference numeral 15 (upper substrate) is a high-temperature substrate.

What is claimed is:

1. A method of reducing a temperature difference between a high-temperature substrate of a first device and a low-temperature substrate of a second device, wherein the low-temperature substrate is at a lower temperature than the high-temperature substrate, the method comprising:
   interposing a solid-phase heat transfer facilitating layer which has a higher thermal conductivity than air and which is deformable to hold particles entrained therein between said high-temperature substrate and said low-temperature substrate;
   maintaining close contact between said high-temperature substrate and said heat transfer facilitating layer and between said low-temperature substrate and said heat transfer facilitating layer; and
   preventing formation of an air layer between said high-temperature substrate and said heat transfer facilitating layer, and between said low-temperature substrate and said heat transfer facilitating layer.

2. The method of claim 1, wherein said heat transfer facilitating layer is formed of a graphite sheet.

3. The method of claim 2, wherein said graphite sheet is a pyrolytic graphite sheet formed by pyrolysis.

4. The method of claim 1, wherein said heat transfer facilitating layer has a thermal conductivity of about 100 W/(m·K) to about 10,000 W/(m·K) in a direction parallel to the heat transfer facilitating layer.

5. The method of claim 1, wherein said heat transfer facilitating layer has a thickness of about 10 μm to about 1,000 μm.

6. The method of claim 1, wherein at least one of said high-temperature substrate and said low-temperature substrate includes silicon.

7. The method of claim 1, wherein said heat transfer facilitating layer includes a metal or a carbon-nano-tube.

8. The method of claim 7, wherein said heat transfer facilitating layer includes a metal, and the metal is one of gold, silver, copper, aluminum, lead free solder and a combination including at least one of the foregoing metals.

9. The method of claim 1, wherein said heat transfer facilitating layer is formed as a thin film on a surface of at least one of said high-temperature substrate and said low-temperature substrate.

10. The method of claim 1, wherein said heat transfer facilitating layer is directly fixed to at least one of said high-temperature substrate and said low-temperature substrate without an adhesive.

* * * * *